Dec. 2, 1958 E. F. ANDREWS 2,863,059

TUNING CONTROL FOR RADIO

Filed July 13, 1953 3 Sheets-Sheet 1

Inventor
Edward F. Andrews
By R. E. Fowler
Attorney

TUNING CONTROL FOR RADIO

Filed July 13, 1953 3 Sheets-Sheet 2

Inventor
Edward F. Andrews

By R. E. Fowler
Attorney

TUNING CONTROL FOR RADIO

Inventor
Edward F. Andrews
By R. E. Fowler
Attorney

United States Patent Office 2,863,059

Patented Dec. 2, 1958

2,863,059

TUNING CONTROL FOR RADIO

Edward F. Andrews, Belleair Beach, Fla., assignor to General Motors Corporation, Detroit, Mich., a corporation of Delaware Application July 13, 1953, Serial No. 367,675

6 Claims. (Cl. 250—40)

This invention relates to indexing and stopping means for movable apparatus and more particularly to indexing or stopping means for variable tuning means of radio apparatus. Automatic radio tuning means has been devised that tunes in sequentially stations transmitting in a frequency band for which the apparatus is designed by the mere operation of a manual switch. These are called "stop-on-signal" or "signal seeking" radio receivers.

In this apparatus means is provided to drive the tuning means to scan the frequency band of the receiver. When an incoming signal is received and amplified, indexing or stopping means is actuated to stop and index the tuning means at that point and permit reception from that station. If another station is desired, the mere closure of a switch will energize the driving means, causing the tuning means to continue on its scanning journey, and the next station signal received will cause the same to again stop on that station. It is the receipt of the incoming signal itself that stops or indexes the tuning means accurately on station. Some of the early forms of signal seeking radio apparatus included a reversible electrical motor for driving the tuning means to scan the band. Later versions utilized a spring motor drive in one direction to tune the receiver over the band and power means energized at the limit of travel to recock or recharge the spring, such for example as solenoid means as shown and described in Andrews Patent #2,493,741.

The addition of any automatic tuning means to radio receivers necessarily increases the cost of the apparatus and signal tuned radio tuning means is more complicated and expensive than other more simple mechanical forms of push button tuning. Signal tuned radio apparatus, however, has decided advantages over other forms such as the absence of preset adjustments for predetermined stations, a minimum of attention required to operate the tuner, and lastly, much more accurate tuning of the receiver to a given station.

It is desired to simplify signal seeking tuning apparatus to reduce the cost thereof to make it more competitive with other less satisfactory types of automatic tuners. The present construction, while continuing the use of the spring drive for moving the tuning means to scan the frequency band, eliminates power actuated means to recock the spring and any attendant controls for such power actuated means. This spring loading function is accomplished manually by the operator and is similar to the construction shown in my copending application Serial No. 195,161, filed November 13, 1950, which issued on December 4, 1956 as Patent No. 2,773,193. By simply moving a movable member operably connected to the tuning means, the latter can be adjusted to one end of the band, reloading the spring, and placing the equipment again in condition to scan the band. Such action is similar to winding a clock spring, but only requires a short movement.

It is therefore an object in making this invention to provide a simple and inexpensive automatic indexing means for movable apparatus.

It is a further object in making this invention to provide a simple and inexpensive automatic driving means for radio tuning purposes.

It is a still further object in making this invention to provide power means for tuning a receiver over a predetermined band with manual means for recharging the power means.

It is a still further object in making this invention to provide a spring driven tuning means acting in one direction with manual means for resetting the tuning means to the limit of travel to reload the spring power means.

It is a still further object in making this invention to provide control means for a signal seeking radio receiver in which compound movement of a control member initiates signal seeking tuning and reloads the power driving means of the tuner respectively.

With these and other objects in view which will become apparent as the specification proceeds, my invention will be best understood by reference to the following specification and claims and the illustrations in the accompanying drawings, in which:

Figures 1, 2, 3:
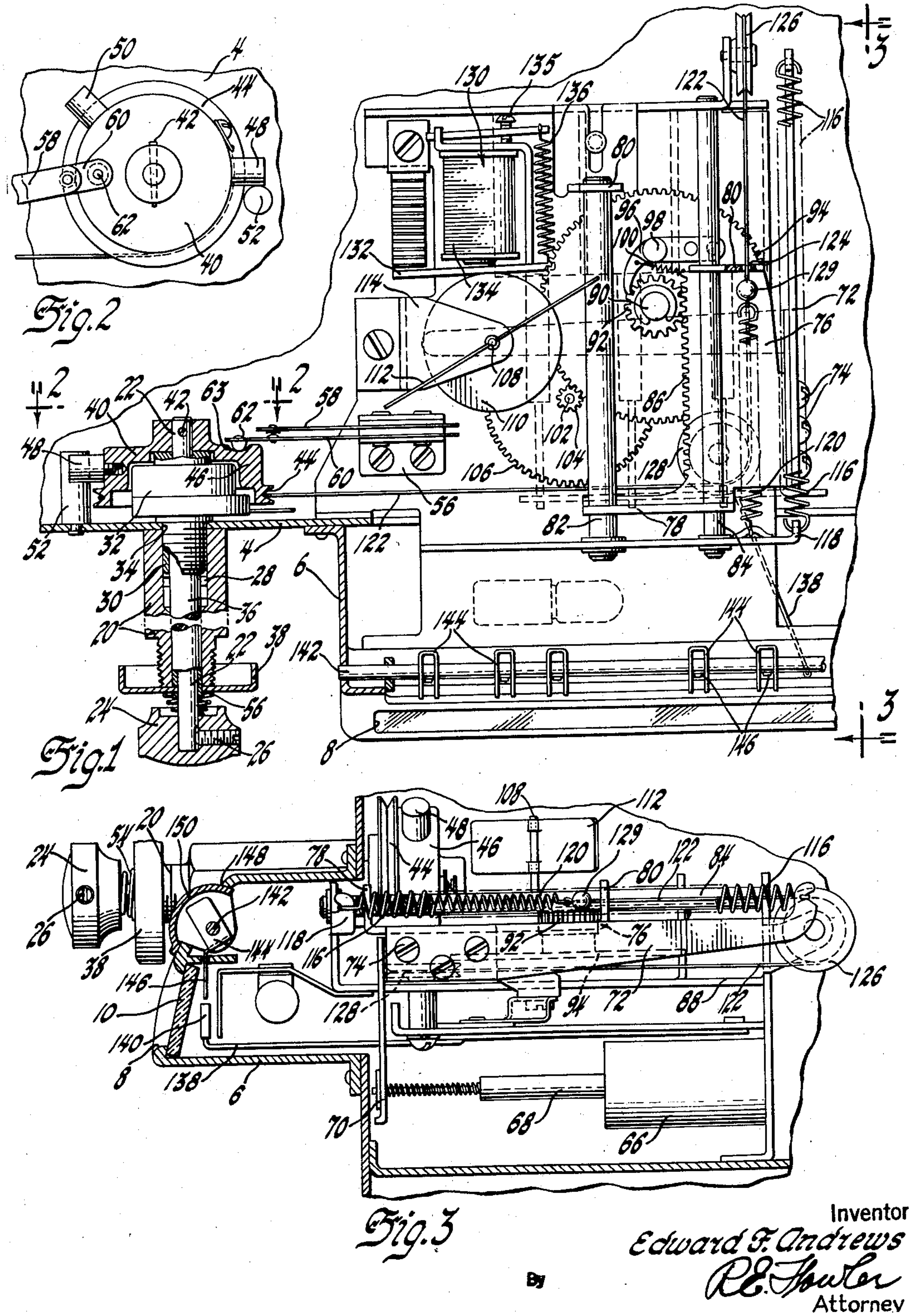
Figure 1 is a top plan view of radio tuning means embodying my invention.
Figure 2 is a sectional view taken on line 2—2 of Figure 1.
Figure 3 is a side elevational view of the device shown in Figure 1 taken on line 3—3 thereof.
Figures 4, 5, 6, 7:
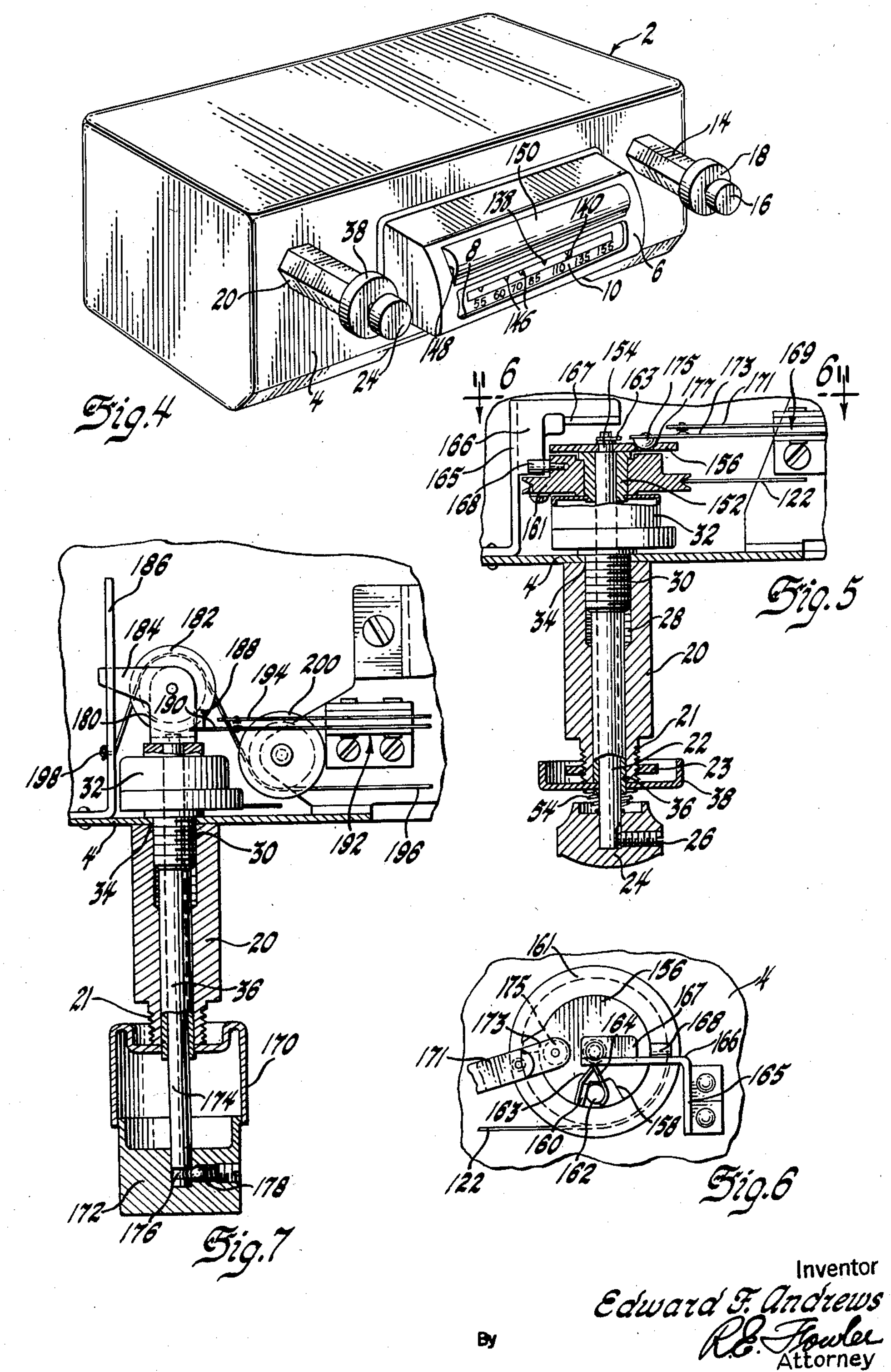
Figure 4 is a perspective view of the exterior of a radio receiver embodying my invention.
Figure 5 is a top plan view of the manual control for the tuning means, partly in section, of a modified form of my invention.
Figure 6 is a sectional view taken on the line 6—6 of Figure 5.
Figure 7 is a view similar to Figure 5 of a still further modified form of manual control.

Referring now more specifically to Figures 4 and 1, there is shown therein a radio receiver of the automotive type indicated generally at 2. From the front panel 4 of the receiver there is supported a projecting housing 6 of roughly rectangular configuration having in its front surface an opening 8 within which a dial plate 10 is supported and behind which an indicating needle 138 traverses the scale to indicate the position of the tuning means. On the right-hand portion of the front panel a mounting extension 14 projects outwardly. This extension 14 is hollow and carries within the same a plurality of concentric independently movable control means, the first terminating in a knob 16 which controls the usual or conventional off-on switch and volume control, and secondly, concentrically therewith and independently rotatable collar 18 on a sleeve which is connected back into the receiver to control the tone of the same.

On the left-hand side a similar hollow mounting extension 20 is secured to the panel 4, and through this extension there projects a central control shaft 22 which has a control knob 24 mounted on its outer end through any suitable means such as a set screw 26. This control shaft is the one which initiates motion of the signal seeking tuning means, and which also is used to reload the power driving means such as a spring. This shaft, therefore, is capable not only of rotary motion in its support, but also a limited amount of axial motion. The supporting member 20 is threaded internally at its end adjacent the panel 4 as at 28, and is screwed onto a projecting threaded extension sleeve 30 from a control member 32 mounted on the inside of the panel 4 and projecting through an opening 34 therein. The control member 32 may be a sensitivity control for the receiver. A control operating sleeve 36 of the member 32 is rotatable and extends out through the supporting member 20, around the shaft 22, inside the sleeve 30, and has secured to its outer end an operating collar 38, rotation of which will adjust the sensitivity control 32.

The shaft 22 extends on through the sensitivity control 32 and operates a mechanism to be described. The inner end of said shaft 22 carries a flanged drum 40 which is secured thereto by a pin 42 extending diametrically through the hub of the drum and the shaft 22. The drum fits around the external surface of the control member 32 and has a pulley section 44 and a cylindrical section 46. The pulley section is provided to drive certain apparatus when the shaft 22 is rotated by manual rotation of the knob 24. A pair of peripherally spaced pins 48 and 50 are threadedly mounted in the drum section 46 to limit the rotation of said drum by alternately striking a fixed stop 52 mounted on the rear face of the wall 4. Thus rotation of the shaft 22 will cause the drum 40 to rotate and drive suitable apparatus. There is also provided a spiral coiled spring 54 around shaft 22 between the outer surface of the control collar 38 and the under-surface of the knob 24 to bias the shaft outwardly, but permit the shaft to be forced inwardly for a short distance.

On a suitable supporting bracket 56 within the casing there are mounted a pair of spring arms 58 and 60 carrying engageable electric switch contacts adapted to initiate the signal seeking tuning action. The arms 58 and 60 are so mounted as to normally space the switch contacts carried thereby apart and arm 60 is longer than arm 58, extending over the rear surface of the drum 40 and carrying a spherical bearing member 62 adapted to seat in a depression 63 in the rear face of the drum 40 when the drum is in its position of rest. Thus either a slight inward rotative movement of the shaft 22 will cause these switch contacts to engage and initiate the signal seeking tuning action, such as that provided by momentary switch closure in previous patented constructions.

The tuning means provided in the present construction is illustrated as a series of inductance coils indicated at 66, the number being dependent of course upon the number of tuned circuits in the radio receiver. Each coil is provided with an iron core 68 which can be inserted into or withdrawn from its associated core to change the inductance thereof for tuning purposes. The cores are commonly supported on a transverse crossmember 70 which forms a part of a travelling carriage which moves longitudinally with respect to the casing for tuning purposes. The transverse member 70 is secured to a longitudinally extending arm 72 by suitable means such as machine screws 74. This carriage also has secured by the same screws and at the same point an irregularly shaped longitudinally extending member 76 which has spaced upstanding flanges 78 and 80. In order to support the travelling carriage formed of these described parts, the upstanding flanges 78 and 80 are provided with openings through which extend two parallel rods 82 and 84, rigidly secured to the casing. It will be noted that flange 78 has considerable width and is located at the front. This flange has openings through which both rods 82 and 84 extend, and therefore supports the front of the carriage.

Flange 80, on the other hand, is relatively narrow, having an opening through which the rearmost portion of rod 84 extends to support the back of the carriage. One face of the longitudinally extending member 76 is toothed as shown at 86, parallel to the rods and longitudinally of the casing. A supporting platform 88 carries a vertically extending shaft 90 on which a pinion 92 is rotatably supported, which pinion 92 is so mounted as to engage the rack teeth 86 on the side of the carriage member 76 and will rotate as the carriage moves. Also rotatably mounted on shaft 90 and freely movable with respect to pinion 92 is a gear wheel 94. On the upper surface of gear wheel 94 is a pivotally mounted pawl 96 pivoted at 98 and spring biased by a spring 100 so that the tip of the pawl 96 will be biased toward the teeth of the pinion 92.

The supporting platform 88 also carries a second spaced vertical shaft 102 upon which there is rotatably mounted a driving pinion 104 adapted to engage the teeth of the gear wheel 94 and to be driven by rotation thereof. Shaft 102 also carries a gear wheel 106 rigidly secured to rotate with the pinion 104. Gear 106 engages drive means, such for example as a pinion (not shown) on the lower end of a rotatably supported shaft 108 which carries a braking disc 110 and an air vane governor 112 in spaced relation. This shaft is rotatably supported by the supporting platform 88 and a bracket member 114, the latter supporting the shaft between the braking disc 110 and the air vane governor 112. The rotation of the gear train will drive the air vane governor as a speed controlling load.

As previously mentioned, the carriage to which the tuning means are connected is biased to drive in one direction by a suitable power storage means such, for example, as a spring. In this instance this is represented as an elongated coil spring 116 which has one end connected to the longitudinally extended arm 72 of the carriage and the other end anchored to an upstanding flanged ear 118 on the framework. Thus when the carriage is forced to its rearmost position in the casing, the spring 116 will be tensioned and tend to move the carriage back toward the front to move the tuning cores 68 out of the tuning inductances and tune the receiver over the band. When the carriage has moved out to its limit, then it must be returned to its innermost position in order to repeat the scanning or tuning action. This reloading action is accomplished in the present construction manually by rotation of the control shaft 22, previously mentioned, through a series of pulleys.

One end of the pulley system is provided by a spring biasing means to keep the system taut. It therefore has a tension spring 120 with one end anchored to the framework and the other end connected to a wire drive member 122. This wire 122 proceeds through a small opening 124 in the upstanding flange 80 of the carriage and around a first pulley 126 rotatably mounted on the rear of the casing. The wire then proceeds back under member 76 and around a rotatable pulley 128 on the upper surface of the platform 88, which pulley 128 is turned at 90° to pulley 126 and directs the wire 122 across the front of the casing and to the pulley 44 on drum 40. The opposite end of the wire is anchored by any suitable means in the groove of the pulley 44. Slidably secured on the wire 122 between the end of the biasing spring 120 and the small opening 124 in the flanged portion 80 is a small bead 129 which supplies the driving force to the flange 80 and moves the carriage toward the rear when desired. It will be obvious that the carriage can move with respect to the wire 122 at any time, and when the pulley driving system is at rest, the ball 129 will be positioned at a point further forward than any position of contact it may have with the carriage during its tuning. When it is desired to reset the carriage toward the back of the casing, upon manual rotation of the shaft 22 by the knob 24, the wire 122 will be wound on the pulley 44, pulling the ball 128 toward the rear and stretching biasing spring 120. The ball, therefore, engages the forward surface of the flange 80 and pulls the whole carriage assembly toward the rear. Upon release by the operator, the spring 120 immediately pulls the ball and wire back to its original position. Since the drum 44 carries physical stops, the spring 120 therefore holds the drum against one of these limit stops in its non-driving condition.

The stopping means for turning and indexing on a particular station is shown as a control relay 130 actuated upon receipt of an incoming signal which has a movable armature 132 spring biased away from the operating coil 134 by a spring 136 which is adjustably tensioned by screw 135. The armature is so mounted as to be adjacent the periphery of the braking wheel 110 and to engage the latter when the relay 130 is deenergized, being held against the braking wheel by said biasing spring 136. In signal seeking devices of this order the relay 130 is energized during the tuning portion of the cycle, which would hold the armature 132 away from the brake, permitting the main drive spring 116 to move the carriage and tune and, when a station is received, the relay 130 will be deenergized, releasing its armature 132 to engage the periphery of the brake shoe 110 and stop the tuning means on that station.

It will thus be seen that the apparatus so far described operates as follows. Assuming that the carriage carrying the tuning means is in its rearmost position with the cores 68 inserted to their fullest extent within the coils 66 and driving spring 116 fully tensioned to provide the driving force, the operator now desires to tune in a transmitting station. He therefore lightly taps the knob 24, forcing the shaft 22 inwardly for a short distance, which closes switch 58, 60 through such a signal seeking control circuit as shown in Andrews Patent No. 2,493,741. Switch 58, 60 may also be closed by a slight rotative movement of shaft 22. Relay 130 is energized, attracting its armature 132 to overcome the bias of the spring 136 and freeing the brake disc 110 so that it may rotate. Spring 116, therefore, causes the carriage to move forwardly and the engagement of the rack teeth 86 with the pinion 92 drives the pinion in a clockwise direction, as seen in Figure 1, which driving force, through the ratchet 96, drives the gear wheel 94 in the same direction. This in turn, through pinion 104 and gear wheel 106, drives the shaft 108 and the air vane governor. The gear train and governor provide a mechanical load for the spring 116 so that the tuning speed will not be too great.

When a station is received, the relay 130 is deenergized, immediately permitting its armature 132 to be moved by spring 136 to engage the periphery of the brake shoe 110 to stop the tuning means at that point. When the tuning means has reached its foremost position, in order to reload the spring 116, the operator twists the knob 24 in a clockwise direction, which winds up the wire 122 on the pulley 44 and through engagement of the ball 128 against the front face of flange 80 of the carriage, will withdraw the carriage to its rearmost position. It is, of course, obvious that it is not necessary to wait until the carriage has reached its foremost position, but that at any time desired the operator may twist the knob 24 sufficiently to move the carriage further toward the rear, and again he need not move it all of the way to one end of the band, but only a short distance to receive a station that he just passed.

This construction also provides means for assisting in the location of desired stations. The receiver is, of course, provided with means for indicating the position of the tuner which is herein shown as an indicating needle 138 which proceeds along the lower portion of the housing 6 and then has an upturned end 140 immediately behind the calibrated dial 10. This advises the operator of the particular position of the tuning mechanism and gives an indication of the station to which the set is tuned. In order to provide the operator with a convenient means for obtaining certain favorite stations to which he may desire to listen for a major portion of the reception time utilized, it is proposed to supply a plurality of adjustable members along the length of the scale which can be positioned adjacent the location of each desired station to assist the operator.

In this particular instance there is provided on the inside of the housing 6 and across the top of the dial a transverse rod 142. Along the length of this rod there are supplied a number of adjustable U-shaped spring clip members 144 which can be moved to any desired position by merely squeezing the forward and upwardly projecting arms to release the pressure on the rod, moving to the new location, and then releasing the same to lock in position. These spring members have a downwardly projecting tongue 146 which extends down behind the dial to a position above the end of the pointer to permit the operator to align any particular arm 146 with the end of the pointer means for indexing. Access to these spring clip devices is provided through a longitudinal opening 148 in the housing 6 over the rod 142, which opening is closed by a hinged cover plate 150 which can be rotated upwardly to provide access to the adjustable clips and then pulled back down to close the opening. These spring clips 144 may be set in adjusted position along the rod 142 by tuning in a desired station on the set, moving a spring clip 144 until its tongue 146 is in vertical alignment with the upper end of the indicating needle, then tuning to the next station which it is desired to indicate, and adjusting a second spring clip member 144 to that position.

If the operator at a later time decides that he wishes to receive the station indicated by one of the clips, and assuming that this particular station is about midway in the band and that the tuning means has progressed almost to its lower end position, the operator may then merely turn the shaft 22 until the needle has moved just beyond the station that he desires, and then release the knob 24 and, assuming no intervening stations, the receiver will tune toward and stop on the desired station. It is not necessary to recock the spring to its extremity and to move the carriage all of the way to the end of the band before releasing it. This also aids in instances where the set is tuning through the band and the operator has just passed a station and desires to return to it. He can merely turn the knob 24 a sufficient amount to recock the carriage just ahead of the desired station and, releasing the knob, obtain that station. This structure produces a very flexible control in the matter of obtaining stations at various positions in the band without the necessity of going entirely to limits of the band in order to reverse control.

Figures 5 and 6 show a modified form of manually controlled mechanism for this type of tuning means. In the previously described construction, the spring reloading or repositioning of the tuning means was performed by rotation of the manual tuning knob 24, whereas the initiation of the signal seeking function of the tuning means was performed by tapping or pressing inwardly on the knob. The construction shown in Figures 5 and 6, while utilizing the same motions to perform these functions, accomplishes the same with modified apparatus. In Figures 5 and 6 there is shown, as before, the front panel 4 of the radio receiver and an opening 34 therein through which the threaded portion 30 of a sensitivity control member 32 extends. To this projecting portion is screwed an elongated supporting sleeve 20 for mounting the receiver on the instrument panel of an automobile (not shown) wherein the forward threaded portion 21 of the sleeve projects through an opening in an instrument panel and is clamped thereto by a lock nut 23.

A control sleeve 36 for the sensitivity control extends through the supporting sleeve 20 and has secured to its outer end a control collar 38 which can be rotated to adjust the setting of the member 32. The main control shaft 22 which extends directly through the sleeve 36 and also on through the sensitivity control 32 has, at its outer end, a manual control knob 24 secured to the shaft by a set screw 26. A coiled spring 54 is mounted around the shaft 22 between the forward face of the collar 38 and the rearmost face of the manually engageable knob 24 to bias the shaft outwardly. The rear portion of the sensitivity control housing supports a bushing member 152 which acts as a bearing for the rear portion of the shaft 22. The shaft 22 at its extremity, which projects beyond bushing 152, is reduced in diameter, as shown at 154, and has secured thereto by any suitable means a control disc 156 which rotates with the shaft 22. The disc 156 has an arcuate sector removed as at 158 and an upstanding lug 160 adjacent one side of said opening. A pulley wheel 161 is rotatably mounted on the bushing 152. The wire 122 is fed to the pulley and the end of the wire anchored thereto. Thus, rotation of the pulley will drive the tuning means and load the power storage spring.

Driving means for the pulley is provided by pin 162 which projects from the rear face of the pulley wheel 161 into opening 158. A crossed arm spring 163 having a central bight fitting over the end of shaft 22 has oppositely disposed legs 164 engaging surfaces of the pin 162 and lug 160 to urge them toward each other. Thus rotation of the shaft 22 drives the pulley wheel 161. An angled bracket 165 is secured to the panel 4 and has two spaced surfaces 166 and 167 that act as stops, one to limit rotary movement and the other reciprocatory. Surface 166 is located adjacent the face of the pulley wheel and is adapted to be engaged by a stop pin 168 carried by the pulley wheel to limit rotative movement thereof. The second surface 167 of the angled bracket extends across behind the disc 156 and is engageable by the inner end of the shaft 22 to limit such inward travel of the shaft against spring 54.

Mounted on a stationary part of the framework is a switch 169 consisting of two spring arms 171 and 173 carrying contacts. These arms are insulated from each other and are so mounted that they are spaced apart unless distorted by some exterior force. Arm 173 is longer than arm 171 and extends over the edge of disc 156 and carries a spherical button 175 therein which engages the rear face of disc 156 and an opening 177 therein. When the disc is in its position of rest with stop pin 168 contacting surface 166, then button 175 rests in opening 177 and the contacts are open. If shaft 22 is either reciprocated or rotated, the contacts will close to energize the locking relay 130. Otherwise, the operation of this modification is the same as that form previously described.

Figure 7 shows a still further modified form of the manually controlled mechanism for this particular type of signal seeking tuner in which the initiation of signal seeking, i. e., the closure of a control switch, and the resetting of the tuning mechanism, are both performed by axial movement of the control shaft, the initial inward movement causing a closure of the switch for initiating signal seeking tuning, and more extended movement causing a recocking of the tuning mechanism. In Figure 7, therefore, there is shown, as before, the front panel 4 of a radio receiver having an opening 34 therein through which projects the hollow threaded extension 30 of a sensitivity control member 32. A supporting sleeve 20 is threaded onto the extension 30 and acts to mount the receiver on some other member. A hollow control shaft 36 for the sensitivity control 32 extends out through the sleeve 20 for operating the sensitivity control. Secured to the outer end of the sleeve 36 is a manually engageable button 170 which is secured to the end of the sleeve 36 to operate the sensitivity control.

This button 170 is hollow and of cylindrical shape, having considerable axial length. A plunger button 172 is adapted to fit inside the hollow button 170 and to slide axially with respect thereto. The main control shaft 174 extends out through the control sleeve 36 and has a peripheral groove 176 near the end into which a retaining spring biased ball 178 may snap to apply the control button 172 to the end of the shaft for assembly. The inner end of the shaft 174 extends through the sensitivity control and has secured thereto at its inner end a bracket 180 which carries a rotatable pully 182. This bracket also has an extension 184 which extends to one side and engages a guide 186 attached to the panel 4 to maintain the bracket against rotation as it slides axially of the support. The bracket 180 also has a projecting ear 188 on the opposite side from the guide which is adapted to engage and move the elongated end of a spring switch arm 190 mounted on a base 192. A second associated switch arm 194 is also mounted on the same base and insulated from the first. A control wire 196 is anchored to the frame at 198 and extends over the pulley 182, then around a portion of the periphery of a guide pulley 200 mounted on the base and thence, in a similar manner to that shown in Figures 1 through 4, to the tuning mechanism.

It will be seen that in this form of invention the initial inward movement of the shaft 174 by pressure on the button 172 will cause the ear 188 to move to the rear, permitting spring arm 190 to close contact with the contact mounted on associated spring arm 194, since spring arm 190 is biased to closed position. This would initiate signal seeking tuning. Any extended inward movement also causes pulley 182 to press against wire 196 therearound, pulling it over pulley 200 and therefore pulling the tuning carriage back as desired. Both signal seeking and recocking means are accomplished by axial inward movement of the button 172.

Figures 8, 9:
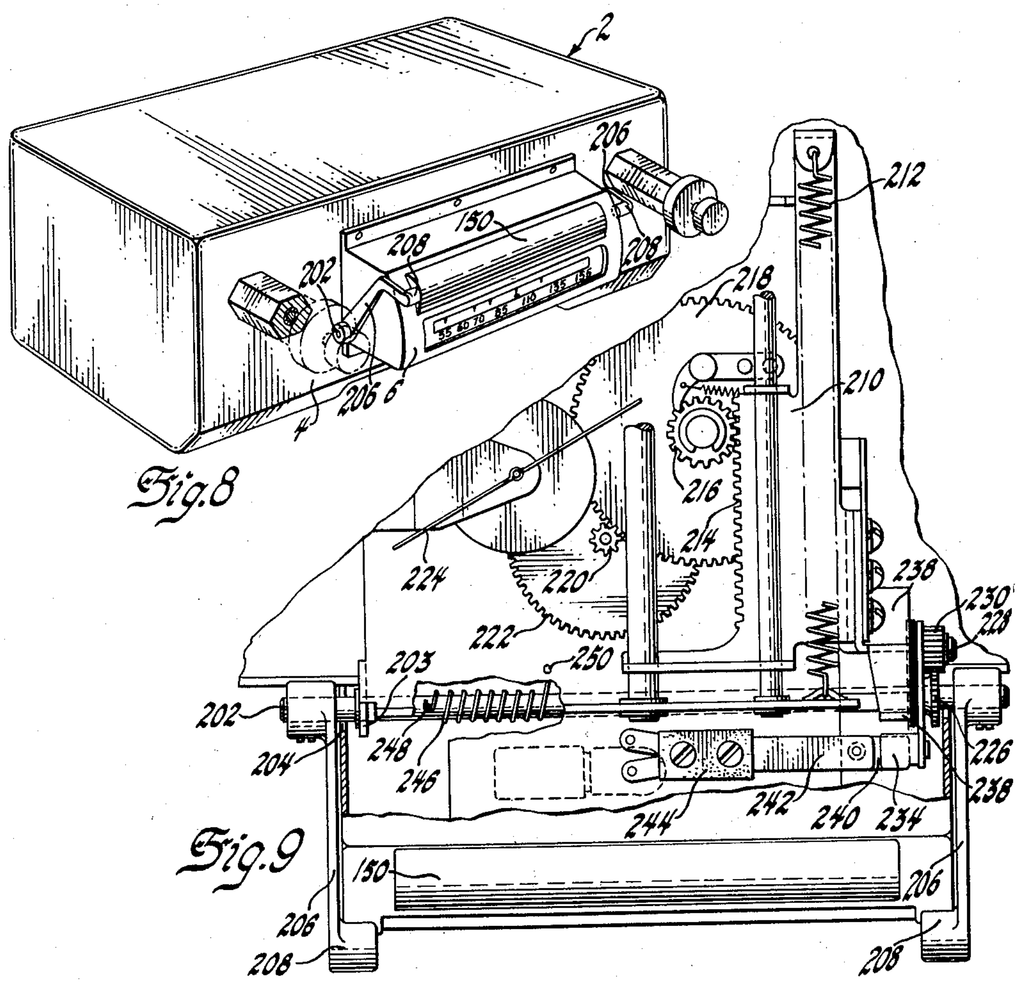
Figure 8 is a perspective view of the exterior of a radio receiver showing the controls thereof of a further modified form of my invention.
Figure 9 is a partial top plan view of the control means for the tuning means included in the embodiment of my invention shown in Figure 8.
Figure 10:
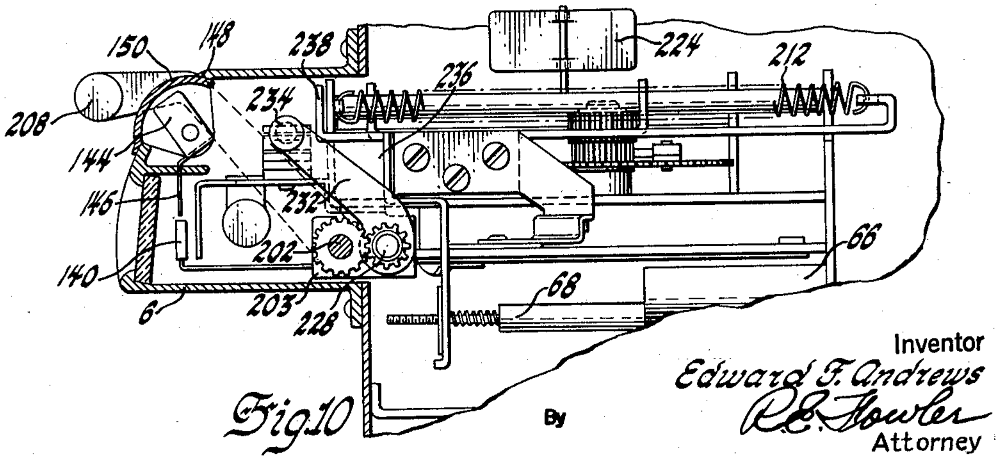
Figure 10 is a side elevational view of the form shown in Figure 9.

In the form of my invention shown in Figures 8, 9 and 10, the reloading of the power storage means for tuning and the initiating of signal seeking are controlled by a pair of levers which are mounted adjacent the housing 6 which, as before, is centrally mounted on the front panel 4 of the receiver and carries the dial indication means. In this case the standard radio controls for off-on switch, volume control, sensitivity control, and tone control are provided as in conventional receivers. The housing 6 in this instance carries a transversely extending shaft 202 trunnioned in supporting brackets 203 on the frame and extending through openings 204 in both sides of the housing and on the outer extending ends of which are mounted two similar control levers 206 having manually engageable forwardly extending portions 208. Thus the shaft 202 can be rotated by downward pressure at either end of the dial.

The carriage 210, which is spring biased by spring 212 toward the front of the casing, is substantially identical with the carriage shown in the construction illustrated in Figures 1 through 4. A gear train including rack 214, pinion 216, gear 218, pinion 220 and gear 222, as in the similar instance, drives an air vane governor 224 for regulating the speed of travel of the device. The tuning means is, of course, carried by the carriage 210. Secured to the shaft 202 to rotate therewith is a small gear 226. Parallel to shaft 202 is a stationary stub shaft 228 having rotatably mounted thereon a gear 230 adapted to mesh with gear 226 and be driven thereby. Secured to the gear 230 to move therewith is a driving lever 232 which extends upwardly and to the left, as shown in Figure 10, and carries on its end an operating member 234. This member is adapted to actuate both the switching means for initiating the signal seeking operation and also to mechanically drive the carriage and return it to its rearmost position, and at the same time tension the driving spring 212.

The carriage is, therefore, provided with an extension arm 236, the forward end of which is flanged upwardly as at 238 to provide a vertical surface which the member 234 may engage and ride over during the process of forcing the carriage to the rear. As the arm 232 rotates, member 234 is also adapted to engage a spring switch arm 240 which lies in the path of movement and cause it to move away from contact with a second shorter spring arm 242 in its initial movement from a position of rest, which switching action controls the stop-on-signal tuner. These two switch arms 240 and 242 are supported on insulating means 244 carried by the framework.

A torsion spring 246 is wound around the shaft 202, at one end of said spring being anchored to said shaft by a pin 248 and the other end of the spring being connected to the framework of the tuner at point 250. This provides a bias on the shaft to tend to rotate it in a direction to maintain the operating levers 206 in their uppermost position, as shown in Figure 8. The rotation of the shaft in this direction is limited by the engagement of the member 234 with the spring arm 240 to maintain the switch formed by arms 240 and 242 open. It will thus be obvious that when the operator wishes to have the tuner proceed to the next sequential station, he merely moves either member 208 downwardly a short distance, which permits closure of the switch 240, 242 to start the signal seeking tuning action. If it is necessary to reload or recock the driving spring 212, further movement of the member 208 downwardly drives the member 234 against the pad 238 to move the carriage to the rear and recock or reload the spring 212. Otherwise the action is the same as in the previous instances.

I claim:

1. In radio apparatus having tuning means therefor, a movable carriage upon which the tuning means is mounted, spring biasing means to bias the carriage toward one limit of travel, locking means to stop the travel of the carriage, a biased pulley system operably engageable with the carriage to reload the spring when it has reached one limit of travel or at intermediate points but permit independent movement of the carriage with respect to the pulley system, rotatable manual means for energizing the pulley system said rotatable manual means also being axially movable, and switching means connected to and controlling the locking means operatively associated with said rotatable manual means to be actuated by said axial movement thereof to control initiation of tuning movement.

2. In radio apparatus having tuning means therefor, a movable carriage upon which the tuning means is mounted, spring biasing means to bias the carriage toward one limit of travel, locking means to stop the travel of the carriage, a thin flexible linear member having one end anchored and extending through an opening in the carriage, biasing means between the member and the anchor to maintain the member taut and yet permit movement, a carriage engaging part mounted on the member and capable of being brought into engagement with the carriage to move the same as the member is moved against its bias, and manually engageable means connected to the member to move the same.

3. In radio apparatus having tuning means therefor, a movable carriage upon which the tuning means is mounted, spring biasing means to bias the carriage toward one limit of travel, locking means to stop the travel of the carriage, a thin flexible linear member having one end anchored and extending through an opening in the carriage, biasing means between the member and the anchor to maintain the member taut and yet permit movement, a carriage engaging part mounted on the member and capable of being brought into engagement with the carriage to move the same as the member is moved against its bias, a manually rotatable shaft, and a pulley wheel mounted on said shaft to which the other end of the flexible member is secured so that upon rotation of the wheel the member is pulled against its bias to cause the part carried thereby to engage the carriage and move it against its spring biasing means to load the same but permit the part to move to a non-interfering position when the manual shaft is released.

4. In radio apparatus having variable tuning means, a movable carriage upon which the tuning means is mounted, spring biasing means connected to the carriage to drive it in one direction, locking means to prevent the carriage from moving under the influence of the spring biasing means, means actuated upon receipt of an incoming signal to operate the locking means, said carriage having an opening therein, a wire passing through said opening, second spring biasing means connected between one end of the wire and a stationary support, and a member fixedly mounted on said wire of larger dimension than the opening in the carriage and on one side of the opening to abut the carriage and move the same when the wire is pulled against the second spring biasing means.

5. In radio apparatus having variable tuning means, a movable carriage upon which the tuning means is mounted, spring biasing means connected to the carriage to drive it in one direction, locking means to prevent the carriage from moving under the influence of the spring biasing means, means actuated upon receipt of an incoming signal to operate the locking means, said carriage having an opening therein, a wire passing through said opening, second spring biasing means connected between one end of the wire and a stationary support, a member fixedly mounted on said wire of larger dimension than the opening in the carriage and on one side of the opening to abut the carriage and move the same when the wire is pulled against the second spring biasing means, and manually engageable means connected to the opposite end of the wire to move the same in opposition to its spring bias and bring the member into engagement with the carriage to move the latter to tune the apparatus.

6. In radio apparatus having variable tuning means, a movable carriage upon which the tuning means is mounted, spring biasing means connected to the carriage to drive it in one direction, locking means to prevent the carriage from moving under the influence of the spring biasing means, means actuated upon receipt of an incoming signal to operate the locking means, said carriage having an opening therein, a wire passing through said opening, second spring biasing means connected between one end of the wire and a stationary support, a member fixedly mounted on said wire of larger dimension than the opening in the carriage and on one side of the opening to abut the carriage and move the same when the wire is pulled against the second spring biasing means, manually engageable means connected to the opposite end of the wire to move the same in opposition to its spring bias and bring the member into engagement with the carriage to move the latter to tune the apparatus, indicating means connected to the carriage to indicate the position thereof, a support mounted parallel to the path of the indicating means, and a plurality of adjustable spaced members on the support along said path to indicate the location of favorite frequencies so that the manually engageable means can be operated to bring the tuner to desired position.

References Cited in the file of this patent

UNITED STATES PATENTS

| | | |
|---|---|---|
| 2,207,467 | Muller | July 9, 1940 |
| 2,231,386 | Jackson | Feb. 11, 1941 |
| 2,326,738 | Andrews | Aug. 17, 1943 |
| 2,494,235 | Gierwiatowski | Jan. 10, 1950 |
| 2,499,573 | Dunn | Mar. 7, 1950 |
| 2,511,580 | Goodrich | June 13, 1950 |
| 2,512,714 | Carlzen | June 27, 1950 |
| 2,622,202 | Gierwiatowski | Dec. 16, 1952 |
| 2,706,787 | Sperber | Apr. 19, 1955 |
| 2,744,193 | Schwarz | May 1, 1956 |
| 2,751,503 | Schwarz | June 19, 1956 |